(12) United States Patent
Neuner

(10) Patent No.: US 11,835,599 B2
(45) Date of Patent: Dec. 5, 2023

(54) PRINTED CIRCUIT BOARD ASSEMBLY

(71) Applicant: ZF Friedrichshafen AG, Friedrichshafen (DE)

(72) Inventor: Alfons Neuner, Pottenstein (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 0 days.

(21) Appl. No.: 17/591,840

(22) Filed: Feb. 3, 2022

(65) Prior Publication Data
US 2022/0244326 A1   Aug. 4, 2022

(30) Foreign Application Priority Data
Feb. 4, 2021   (DE) .......................... 102021201008.3

(51) Int. Cl.
*G01R 33/07*   (2006.01)
*G01R 15/20*   (2006.01)

(52) U.S. Cl.
CPC ........... *G01R 33/07* (2013.01); *G01R 15/202* (2013.01)

(58) Field of Classification Search
CPC ........ G01R 33/07; G01R 15/202; G01R 1/02; G01R 15/207; G01R 33/0011; G01R 33/0047
See application file for complete search history.

(56) References Cited

U.S. PATENT DOCUMENTS

| | | | |
|---|---|---|---|
| 2008/0143329 A1* | 6/2008 | Ishihara | G01R 15/207 324/252 |
| 2009/0278526 A1* | 11/2009 | Yoshida | G01R 15/202 324/117 H |
| 2014/0002073 A1* | 1/2014 | Fink | G01R 33/0023 324/244 |
| 2016/0276577 A1* | 9/2016 | Ebihara | H01L 43/04 |
| 2017/0131329 A1* | 5/2017 | Gorai | G01R 15/207 |
| 2018/0031612 A1* | 2/2018 | Blaes | H01R 13/6683 |
| 2019/0250221 A1* | 8/2019 | Vorndran | G01R 33/072 |

* cited by examiner

*Primary Examiner* — Alvaro E Fortich
(74) *Attorney, Agent, or Firm* — Crowell & Moring LLP

(57) ABSTRACT

A printed circuit board assembly may have a printed circuit board with at least one electric component. A magnetic field sensor for measuring a magnetic field may be included, where an amperage of a current conducted in the electric component is determined on the basis of the magnetic field. The assembly may also include a magnetic conductor for conducting the magnetic field, which is then measured by the magnetic field sensor.

17 Claims, 1 Drawing Sheet

PRINTED CIRCUIT BOARD ASSEMBLY

RELATED APPLICATION

This application claims the benefit of, and priority to, German Patent Application DE 10 2021 201 008.3, filed Feb. 4, 2021, which is incorporated by reference herein in its entirety.

BACKGROUND

The present disclosure relates to printed circuit board assemblies.

BRIEF DESCRIPTION OF THE DRAWINGS

Certain embodiments shall be explained in greater detail below in reference to the schematic drawings of exemplary embodiments. Therein.

Figure 1:
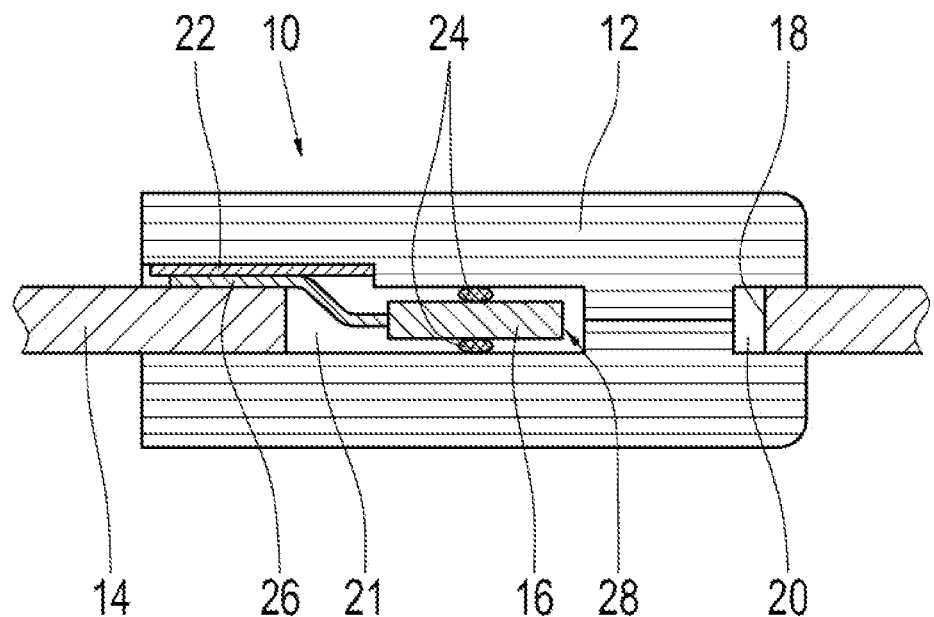
FIG. 1 shows a schematic cutaway view of one embodiment with aspects in accordance with the present disclosure.

The attached drawings are intended to provide a greater understanding of certain the embodiments. They illustrate embodiments and serve, in conjunction with the description, to explain certain principles and concepts. Other embodiments and many of the specified advantages can be derived from the drawings. The elements of the drawings are not necessarily drawn to scale.

Elements, features and components that are identical, functionally identical, and have the same effect, all have the same reference symbols in the drawings, as long as not otherwise specified.

DETAILED DESCRIPTION

FIG. 1 shows a schematic diagram of a cutaway view of a printed circuit board assembly 10 according to an embodiment. The printed circuit board assembly 10 substantially comprises a printed circuit board 14, a magnetic field sensor 16 for measuring a magnetic field, and a magnetic conductor 12.

The magnetic conductor 12 is in the form of an electrical sheet packet in FIG. 1, and the magnetic field sensor 16 is formed by a Hall sensor.

An electronic component (not shown) that can be supplied with a current, and which generates a magnetic field, is mounted on the printed circuit board. The magnetic field sensor 16 is configured to measure the strength of the magnetic field. To prevent a weakening of the magnetic field at the location of the magnetic field sensor due to the distance between the magnetic field sensor 16 and the electronic component that generates the magnetic field, the magnetic field sensor 16 is encompassed by the electrical sheet packet. The electrical sheet packet bundles the magnetic field that is to be measured by the magnetic field sensor 16 at the location of the Hall sensor.

To transfer measurements of the Hall sensor to the printed circuit board 14, the printed circuit board 14 and the Hall sensor are connected by an electric conductor 26, which is in contact with a conductor path (not shown) on the printed circuit board 14. The electric conductor is electrically insulated in the electrical sheet packet by an insulator 22. The insulator 22 can be formed by a film or lacquer, for example.

The electrical sheet packet is composed of an upper surface and a lower surface, which are connected to one another. A groove 20 is formed in the electrical sheet packet between the upper surface and the lower surface, at which the electrical sheet packet is retained or supported in a recess 18 or hole in the printed circuit board 14.

The upper surface and lower surface also form a receiver 28 in the middle of the electrical sheet packet, in which a magnetic field sensor 16 is positioned. The magnetic field sensor 16 is retained in the receiver by securing means or securement area 24. The securing means may formed by an amount of a plastically shapeable soft material (e.g., two opposing portions of the shapeable, relatively soft/compliant material, as shown).

Convex material buildups without a specific shape made of this material are located above and below the sensor. The magnetic field sensor 16 is retained in the middle of the receiver 28 by this means, and vibrations transferred from the electrical sheet packet thereto are dampened.

Figure 2:
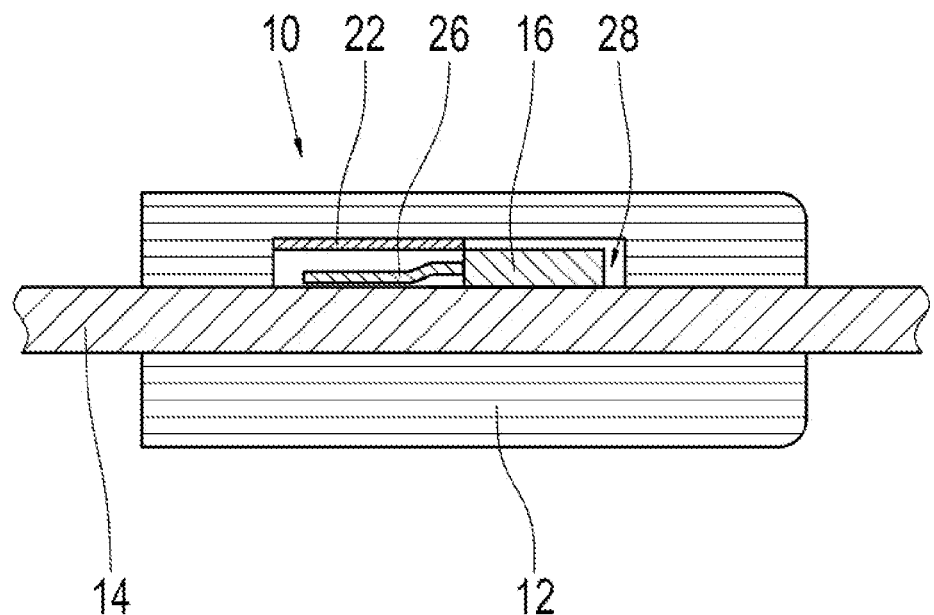
FIG. 2 shows a schematic cutaway view of one embodiment with aspects in accordance with the present disclosure.

FIG. 2 shows a schematic diagram of a cutaway view of a printed circuit board assembly 10 according to another embodiment. Unlike the printed circuit board assembly 10 in FIG. 1, the magnetic field sensor 16 is mounted on the printed circuit board 14.

The electrical sheet packet comprises, like that in FIG. 1, an upper surface and a lower surface, each of which are attached to the printed circuit board 14.

Having described various aspects of the subject matter above, additional disclosure is provided below that may be consistent with the claims originally filed with this disclosure and/or the priority document. In describing this additional subject matter, reference may be made to the previously described figures. Any of the following aspects may be combined, where compatible.

A printed circuit board assembly that contains a printed circuit board with at least one electric component, a magnetic field sensor for measuring a magnetic field, wherein an amperage of a current conducted in the component is determined on the basis of the magnetic field, and a magnetic conductor for a magnetic field measured by the magnetic field sensor.

An electrical sheet packet comprises numerous stacked sheets made of a magnetic material.

A printed circuit board, also referred to as a circuit board, card, conductor plate, or PCB, is used to affix electronic components. A printed circuit board is used to mechanically affix components, and to connect them electrically.

A sensor, also referred to as a detector, (measurement value or measurement) receiver, or (measurement) probe, is a technical component that can qualitatively or quantitatively detect certain physical or chemical properties or states as a measurement value, e.g. temperature, humidity, pressure, speed, brightness, acceleration, pH value, ionic strength, electrochemical potential, and/or the material quality of its environment. These values are obtained by means of physical or chemical effects, and converted as sensor data to an electrical signal that can then be further processed.

A magnetic field sensor is a sensor device for measuring magnetic flux densities. A Hall sensor is a magnetic field sensor that measures a magnetic field on the basis of its Hall effect.

A groove is an elongated recess.

An electronic component is a component that can conduct charges. By way of example, conductor paths, switches, capacitors, etc. are electronic components.

Connecting elements that can readily conduct magnetically are analogous to metallic connecting lines in an electrical circuit. Magnetic conductors are characterized in that the ratio of the magnetic voltage to the magnetic flux in the magnetic conductor material is practically zero.

One example of a magnetic conductor is the magnetic core in a transformer or a coil. The decisive condition for magnetically conductive materials is a high value of the relative permeability.

An electrical line is used to transfer electricity or signals. An electrical line can be in the form of a cable, and/or it can be formed on a printed circuit board, and it can have one or more strands. The term "line" can refer to both differential lines that have at least two strands, as well as "single-ended" lines for asymmetrical signal transfer. The term strand comprises both the conductors in a cable as well as the conductors in a line on a printed circuit board.

One non-limiting fundamental idea is to measure an amperage of a current conducted in a component on a printed circuit board via a magnetic field by means of a magnetic field sensor. The magnetic field is also conducted to the sensor by means of a magnetic conductor.

It is therefore possible to place a magnetic field sensor for measuring a magnetic field in a component at a distance to the component. As a result, the sensor is not disrupted by the component.

Advantageous designs and developments can be derived from the dependent claims and the description in reference to the drawings.

According to a preferred embodiment, the magnetic conductor is in the form of an electrical sheet packet that encompasses the magnetic field sensor. Electrical sheet packets bundle magnetic fields together. As a result, a magnetic field can be lengthened by an electrical sheet packet.

Weak magnetic fields can also be measured by bundling them.

A soft magnetic block made of ferrite or some other soft magnetic material, or a plastic block in which a soft magnetic material is integrated, can also be used.

According to a preferred embodiment, the electrical sheet packet has a receiver in which the magnetic field sensor is accommodated. This receiver can be placed at a convenient location in the electrical sheet packet when the positions of the magnetic field that is to be measured and the electrical sheet packet are known. The receiver is typically located where the magnetic field is strongly bundled.

According to a preferred embodiment, the magnetic field sensor is secured to the electrical sheet packet by means of a plastically shapable securing means. As a result, the securing means for the magnetic sensor can be placed in the middle of the hole. This makes it possible for the securing means to absorb vibrations.

According to a preferred embodiment, the magnetic field sensor is electrically connected to the printed circuit board by an electrical conductor, and the magnetic conductor has an insulating material that insulates the electrical conductor in relation to the magnetic conductor. This makes it possible to obtain an electrical connection between the sensor and the printed circuit board that is protected against a short circuit.

According to a preferred embodiment, the magnetic field sensor is located in a hole, in particular a hole in the printed circuit board. Consequently, the sensor can be placed near the electronic component. This also reduces the necessary space for a printed circuit board assembly.

It is also beneficial if the electrical sheet packet has a groove, by means of which the electrical sheet packet is supported in relation to the printed circuit board. This simplifies the (pre)assembly of the printed circuit board assembly.

According to a preferred embodiment, the magnetic field sensor is placed on the printed circuit board. This increases the freedom of design for the printed circuit board assembly, because the sensor can be mounted directly on the printed circuit board.

REFERENCE SYMBOLS 10 printed circuit board assembly
12 magnetic conductor
14 printed circuit board
16 magnetic field sensor
18 hole
20 groove
22 insulator
24 securing means
26 electrical conductor
28 receiver

I claim:

1. A printed circuit board assembly, comprising:
a printed circuit board having an electric component;
a magnetic field sensor comprising a Hall sensor,
wherein the magnetic field sensor is configured for measuring a magnetic field, and
wherein an amperage of a current conducted in the electric component is determined on the basis of the magnetic field; and
a magnetic conductor for conducting the magnetic field that is measured by the magnetic field sensor,
wherein the magnetic conductor includes an electrical sheet packet that encompasses the magnetic field sensor.

2. The printed circuit board assembly according to claim 1, wherein the electrical sheet packet has a receiver cavity, and wherein the magnetic field sensor is located in the receiver cavity.

3. The printed circuit board assembly according to claim 1, wherein the magnetic field sensor is secured to the electrical sheet packet with a securement device that includes a plastically-deformable material.

4. The printed circuit board assembly of claim 3, wherein the securement device includes two portions of the plastically-deformable material, and wherein the magnetic field sensor is located between the two portions of the plastically-deformable material.

5. The printed circuit board assembly according to claim 1, wherein the magnetic field sensor is electrically connected to the printed circuit board via an electrical conductor, and wherein the magnetic conductor has an insulator to electrically insulate the electrical conductor from the magnetic conductor.

6. The printed circuit board assembly according to claim 1, wherein the magnetic field sensor is located in a hole in the printed circuit board.

7. The printed circuit board assembly according to claim 6, wherein the magnetic conductor includes an electrical sheet packet with a groove, and wherein the groove secures the electrical sheet packet in relation to the printed circuit board.

8. The printed circuit board assembly according to claim 1, wherein the magnetic field sensor is located on the printed circuit board.

9. A printed circuit board assembly, comprising:
a printed circuit board;
a magnetic conductor for conducting a magnetic field, the magnetic conductor including a receiving cavity, wherein the printed circuit board extends at least partially into the receiving cavity; and a magnetic field sensor located in the receiving cavity and configured for measuring the magnetic field formed by the magnetic conductor, wherein an amperage of a current conducted in an electric component of the printed circuit board is determined on the basis of the magnetic field, and wherein the magnetic field sensor is located in a hole in the printed circuit board.

10. The printed circuit board assembly according to claim 9, wherein the magnetic field sensor is secured within the receiving cavity with a securement device that abuts a wall of the receiving cavity.

11. The printed circuit board assembly of claim 10, wherein the securement device includes a first plastically-deformable material portion that abuts the wall of the receiving cavity and also abuts the magnetic field sensor.

12. The printed circuit board assembly of claim 11, wherein the securement device includes a second plastically-deformable material portion that abuts a second wall of the receiving cavity and also abuts the magnetic field sensor such that the magnetic field sensor is located between the first plastically-deformable material portion and the second plastically-deformable material portion.

13. The printed circuit board assembly according to claim 9, wherein the magnetic field sensor is electrically connected to the printed circuit board via an electrical conductor, and wherein the magnetic conductor has an insulator to electrically insulate the electrical conductor from the magnetic conductor.

14. The printed circuit board assembly according to claim 9, wherein the magnetic conductor includes an electrical sheet packet with a groove, and wherein the groove secures the electrical sheet packet in relation to the printed circuit board.

15. The printed circuit board assembly according to claim 9, wherein the magnetic field sensor is located on the printed circuit board.

16. A method, comprising:

assembling a printed circuit board assembly, the printed circuit board assembly comprising:

a printed circuit board;

a magnetic conductor for forming a magnetic field, the magnetic conductor including a receiving cavity, wherein the printed circuit board extends at least partially into the receiving cavity; and a magnetic field sensor located in the receiving cavity and configured for measuring the magnetic field formed by the magnetic conductor, wherein an amperage of a current conducted in an electric component of the printed circuit board is determined on the basis of the magnetic field, and wherein the magnetic field sensor is secured within the receiving cavity with a securement device that abuts a wall of the receiving cavity.

17. The method according to claim 16, the magnetic field sensor is secured within the receiving cavity with a securement device, and wherein the securement device includes two plastically-deformable material portions abutting opposite walls of the receiving cavity, and wherein the magnetic field sensor is located between the two plastically-deformable material portions of the securement device.

* * * * *